United States Patent [19]

Anderson

[11] Patent Number: 4,482,778
[45] Date of Patent: Nov. 13, 1984

[54] SOLAR ENERGY CONVERTER USING SURFACE PLASMA WAVES

[75] Inventor: Lynn M. Anderson, Lyndhurst, Ohio

[73] Assignee: The United States of America as represented by the Administrator of the National Aeronautics and Space Administration, Washington, D.C.

[21] Appl. No.: 486,470

[22] Filed: Apr. 19, 1983

[51] Int. Cl.³ .......................................... H01L 31/06
[52] U.S. Cl. .................................. 136/246; 136/255; 357/30
[58] Field of Search ............... 136/243, 244, 246, 252, 136/254, 255, 256; 357/30, 12; 250/211 J, 212

[56] References Cited

U.S. PATENT DOCUMENTS

| | | | |
|---|---|---|---|
| 2,320,185 | 5/1943 | Lamb | 136/256 |
| 3,475,609 | 10/1969 | Schneider | 350/355 |
| 3,821,549 | 6/1974 | Gloge | 250/211 J |
| 3,912,931 | 10/1975 | Gravisse et al. | 250/458 |
| 4,021,267 | 5/1977 | Dettling | 136/246 |
| 4,081,289 | 3/1978 | Campbell | 136/246 |
| 4,204,881 | 5/1980 | McGrew | 136/246 |
| 4,251,679 | 2/1981 | Zwan | 136/244 |
| 4,377,722 | 3/1983 | Wested | 136/244 |

OTHER PUBLICATIONS

G. Cheek et al., "MIS and SIS Silicon Solar Cells: A Review", *Proceedings, 3rd E.C. Photovoltaic Solar Energy Conf.*, (1980), Reidel Pub. Co. (1981), pp. 353–357.
R. Singh et al., "Tunnel MIS Solar Cells", *J. Vac. Sci. Technol.*, vol. 14, pp. 89–91 (1977).
"Deposition of Semiconductor Films with High Solar Absorptivity", D. M. Mattox et al.–*J. Vac Sci. Technol.*, vol. 12, No. 1, Jan./Feb. 1975, pp. 182–185.
"Photon Excitation of Surface Plasmons in Diffraction Gratings", C. E. Wheeler et al., *Physical Review B;* vol. 13, No. 6; Mar. 15, 1976, pp. 2372–2376.
"Pushing Particles with Waves", N. J. Fisch; *American Scientist*, vol. 71; Jan./Feb. 1983, pp. 27–35.

Primary Examiner—Aaron Weisstuch
Attorney, Agent, or Firm—Norman T. Musial; John R. Manning

[57] ABSTRACT

Sunlight is dispersed over a diffraction grating (12) formed on the surface of a conducting film (14) on a substrate (16). The angular dispersion controls the effective grating period so that a matching spectrum of surface plasmons (18) is excited for parallel processing on the conducting film. The resulting surface plasmons (18) carry energy to an array (20) of inelastic tunnel diodes. This solar energy converter does not require different materials for each frequency band, and sunlight is directly converted to electricity in an efficient manner by extracting more energy from the more energetic photons.

20 Claims, 2 Drawing Figures

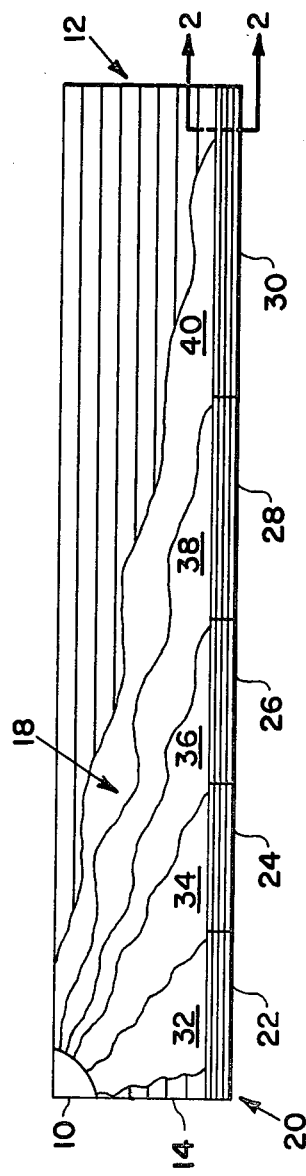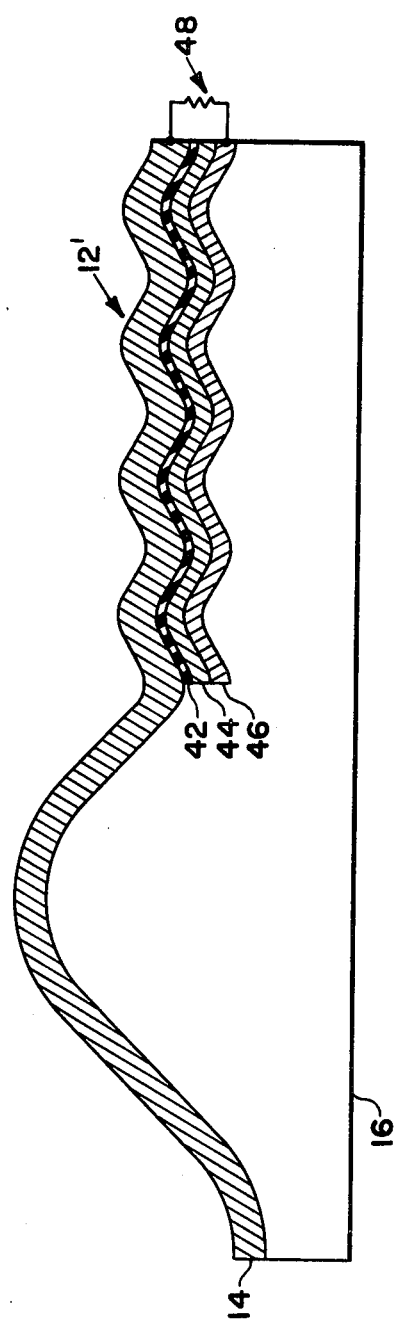

SOLAR ENERGY CONVERTER USING SURFACE PLASMA WAVES

DESCRIPTION

ORIGIN OF THE INVENTION

The invention described herein was made by an employee of the U.S. Government and may be manufactured and used by or for the Government for governmental purposes without the payment of any royalties thereon or therefor.

TECHNICAL FIELD

This invention is concerned with the direct conversion of sunlight to electricity. The invention is particularly directed to achieving high efficiency by extracting more energy from the more energetic photons using a technique which does not require different materials for each frequency band.

Conventional solar cells are inefficient because they are unable to use a broad frequency spectrum effectively. Incident photons have a range of energies from about 0.4 electron volts in the infrared to about 3.5 electron volts in the ultraviolet. However, the conduction electrons used to transport energy within a semiconductor are monoenergetic, i.e. about 1.1 electron volts in silicon. Low energy photons cannot excite these carriers, while high energy photons have excessive energy which is lost to heat in picoseconds. Consequently, over half the incident power is lost before the electrons even begin diffusing towards the collecting junction. For example, it has been shown that only about 44% of the incident energy striking an ideal silicon solar cell is delivered to the junction where about half is extracted as useful power.

Spectrum-splitting techniques increase the efficiency by tailoring the conversion process to separate energy bands within the broad solar spectrum. More particularly, different semiconductors are used to support conduction electrons of different excitation energies. In principle, a spectrum-splitter with at least a dozen different semiconductors could achieve 50% efficiency at 300° K., or 60% at 1000 suns concentration. In practice, additive losses and increased complexity offset the incremental gains, limiting the potential efficiency to about 30% with two or three channels.

By way of example, in spectrophotovoltaic systems, the beam is usually split with a series of dichroic mirrors, and the number of channels is limited by the mirror optical losses. Twenty-eight percent efficiency (AM 1.6) has been demonstrated at 165 suns concentration, but the bulky optical package makes present devices impractical.

In cascades, on the other hand, different solar cells are stacked to allow transmission of low energy photons into the low band gap semiconductors. Typically, cascades are grown as a single unit using lattice-matched III-V alloys for the individual cells and heavily doped tunnel junctions to interconnect them in electrical series. Materials compatability and tunnel junction resistance limit the number of channels. The best efficiencies are about 20% to date.

BACKGROUND ART

Concurrently filed copending patent application Ser. No. 486,471 which is entitled "Inelastic Tunnel Diodes" discloses a new and novel diode which can be used to extract energy from surface plasmons. The subject matter of this patent application is hereby incorporated by reference, although the diode disclosed in the aforementioned patent application is obviously not limited to this use. Reference is made to the patents cited in the copending patent application for a discussion of other prior art structures and techniques of possible interest.

McGrew U.S. Pat. No. 4,204,881 discloses a solar power system in which sunlight is dispersed by a diffraction grating. The separated spectrum is caused to fall upon a series of photocells, each of which is of the highest efficiency with respect to that portion of the spectral waves impinging on it.

Dettling U.S. Pat. No. 4,021,267 also uses different semiconductors for each frequency band to extract energy.

DISCLOSURE OF INVENTION

In the present invention, sunlight excites a continuous spectrum of surface plasmons. This provides for parallel processing of different frequency bands on the same conducting surface.

Surface plasmons are guided electromagnetic waves which involve oscillations in the valence electron density at a conducting surface. Such oscillations are created when solar fields polarize surface charge on a conductor. To launch self-sustaining surface plasmons, a means is provided for phase-matching between a photon and a slightly slower plasmon of the same energy. Prisms, lenses, diffraction gratings, or textured surfaces are used for this purpose.

The surface plasmons then transport energy to an array of tunnel diodes, each tuned to extract maximum power from plasma waves of different frequencies. The metal-insulator-semiconductor-metal (MISM) diodes all share the same materials, but differ in geometry. They are tuned by varying the load or geometry to produce the appropriate operating voltage for each frequency band.

In the MISM diodes, plasmons are absorbed by electrons tunneling across the thin insulating layer. This process is most efficient for plasmon modes in which energy is localized in the insulation region, whereas the surface plasmon's energy is localized just above the metal surface. Gratings, textured surfaces, or special geometries, such as tapers, are used to phase-match the relativistic surface plasmons to slower junction plasmons, allowing energy transfer into the tunneling region.

Energy is extracted from the junction plasmons by inelastic tunneling. This is a one-step process in which an electron from the low voltage electrode simultaneously absorbs a plasmon and tunnels across the insulating barrier to higher potential. To prevent backflow, a semiconductor is used on the low voltage side.

BRIEF DESCRIPTION OF THE DRAWINGS

The objects, advantages, and novel features of the invention will be more fully apparent from the following detailed description when read in connection with the accompanying drawing wherein FIG. 1 is a schematic top view of a solar energy converter constructed in accordance with the invention, and FIG. 2 is an enlarged section view taken along the lines 2—2 in FIG. 1.

BEST MODE FOR CARRYING OUT THE INVENTION

The preferred embodiment of the present invention utilizes concentrated sunlight which is dispersed by a lens or prism 10 over a diffraction grating 12 formed on the surface of a conducting film 14 on a substrate 16. The grating 12 provides phase-matching between photons and slightly slower surface plasmons of the same energy in a manner well known in the art. Such a diffraction grating is described in "Photon Excitation of Surface Plasmons in Diffraction Gratings: Effect of Groove Depth and Spacing" by C. E. Wheeler et al, vol. 13, no. 6, pages 2372-2376 of the *Physical Review B* dated Mar. 15, 1972. The angular dispersion produced by the lens or prism 10 controls the effective grating period, so that sunlight can excite a matching spectrum of surface plasmons 18 which are processed in parallel on the conducting film 14.

The resulting surface plasmons 18 carry energy to an array 20 of inelastic tunnel diodes 22,24,26,28, and 30 which are of the type described in copending application Ser. No. 486,471. These diodes are tuned to extract maximum power from surface plasmons in the different frequency bands 32,34,36,38, and 40, respectively. The diodes differ in geometry and operating voltage, but all share the same materials. In this embodiment, the inelastic tunnel diodes comprise the metal conducting film 14, an insulating film 42, a semiconductor film 44, and a metal 46 film (MISM) on the substrate 16. The surface of the tunnel diode array 20 also forms a diffraction grating 12' of shorter period which provides phase-matching between the surface plasmons and the slower junction plasmons localized in the insulating film 42. This facilitates energy transfer into the tunneling region where junction plasmons are absorbed to pump electrons to higher potential.

In the inelastic tunneling process, an electron from the low voltage electrode 44-46 absorbs a junction plasmon and simultaneously tunnels across the thin insulating layer 42 to higher potential in the conducting film 14. The semiconductor layer 44 prevents back flow of excited electrons because there are no allowed states in the bandgap. Individual loads 48 may be connected between metal film 14 and 46, or the diodes may be designed for connection in series. The operating voltage determines the energy extracted from the incident plasmons so the diodes may be tuned to different frequency bands by varying the load, or by choosing the proper geometry to produce a predetermined plasmon current. This provides for a high degree of spectrum-splitting without sequential losses or unique materials for each frequency band.

Describing the invention in more detail, the surface plasmons 18 are charge polarization waves involving oscillations in the valence electron density at the conducting surface 12. The propagating wave of surface charge is accompanied by transverse and longitudinal electromagnetic fields which decay exponentially with distance from the interface. Typically, the fields extend a tenth to several thousand microns above the surface of the grating 12, but they penetrate only a few hundred angstroms into the conducting film 14. Thus, only a thin film of conducting material is required. This provides for an extremely lightweight system for space use, or a materials-conservative device on a low-cost substrate for terrestrial applications. Film thicknesses on the order of 100 to 600 angstroms are contemplated, but thick conductors could also be used. Native oxides may be present, and dielectric overlayers or coverglasses could be added. The conducting film 14 is a metal with high plasma frequency, good conductivity, and high reflectivity at predetermined frequencies.

The surface plasmon spectrum 18 is broad and continuous from the infrared to cut-off frequencies which lie in the visible or ultraviolet, depending on the material and geometry. Group and phase velocities are relativistic except near cut-off. The relativistic waves have field patterns in which most of the energy travels just above the surface of the conducting film 14. This reduces the effects of substrate absorption. Typically, the surface plasmon range is 5 to 5000 microns at solar frequencies, and centimeters in the infrared. For comparison, conduction electrons in a gallium arsenide solar cell have a 3 to 5 micron range. The surface plasmon range does not place a severe constraint on the proximity of the collecting diodes in the array 20. In fact, the high values provide for compromise in materials and materials quality, allowing evaporated films to be used. This contrasts markedly with conventional solar cell designs where high purity single crystals are generally required to insure adequate electron and hole diffusion lengths.

Sunlight can excite the surface plasmons 18 when its fields polarize surface charge on the conductor 14. S-polarized photons, which have purely tangential electric fields, cannot induce charge on a smooth surface. However, deep surface texture on the scale of the wavelength insures effective coupling of both polarizations. Incoherent light does not pose a problem. The excitation process preserves coherence, but does not require it.

Given charge fluctuations at a surface plasmon frequency, the plasma wave cannot be excited unless parallel momentum is conserved. Prisms, lenses, gratings, or textured surfaces are used to phase match photons to slower surface plasmons of the same energy.

In FIG. 1, a periodic structure, such as the diffraction grating 12, creates photon harmonics with parallel momentum shifted by multiples of the inverse grating period. When one diffracted order satisfies the phase-matching condition, energy is withdrawn from all orders proportionately. Because the surface plasmon velocity varies with frequency, a range of grating periods is required to couple the solar spectrum. In this embodiment an optical device 10, such as a prism or geodesic lens, is used to disperse the spectrum into the series of frequency bands 32-40 over the fixed grating in the surface 12. Angular dispersion controls the effective grating period and directs the surface plasmons towards the array 20 of appropriately tuned diodes 20-30. These diodes are tuned to extract maximum power from surface plasmons in frequency bands 32-40, respectively.

Most of the surface plasmon's energy is carried in electromagnetic fields just above a conducting film 14. Only a small fraction of the energy leaks down to the insulator 42, so coupling to tunneling electrons is weak. For optimum results, surface plasmons are converted into slower junction plasmons whose energy is localized in the central regions of the MISM diodes. For example, in a typical geometry with a 200 angstrom metal film 14, only 0.1 to 0.001 percent of the surface plasmon's energy is localized in the insulator 42 at solar frequencies. However, 70 to 99% of the junction plasmon's energy can be concentrated in a 30 angstrom oxide layer forming the insulator 42. This provides strong fields to accelerate the tunneling electrons.

Gratings, textured surfaces, or special geometries such as tapers are required to couple the surface and junction waves because the surface plasmons are relativistic while junction plasmons typically travel at only a sixth the speed of light. A grating or textured surface can be used to slow the surface plasmon's first harmonic into synchronism with a junction wave, thereby providing energy transfer into the insulating layer 42. The grating period depends on frequency and structure, but it is typically on the order of 0.05 to 0.5 microns. There is adequate space for a grating or series of gratings because the surface plasmon typically travels up to 5000 microns before its energy is lost to heat. Other design considerations are discussed in copending patent application Ser. No. 486,471.

Junction plasmons have opposite charge patterns on the inner metal surfaces 14 and 46 resulting in strong transverse electric fields which can accelerate tunneling electrons. There is a resonant interaction between the plasmons and tunneling electrons whose quantum mechanical wave functions oscillate in phase with the plasmons. The resonant wave particle interaction is defined in an article entitled "Pushing Particles With Waves" by N. J. Fisch which was published in the *American Scientist*, Vol. 71, No. 1, January–February 1983, pages 27–35.

An energy conversion diode absorbs junction plasmons to pump electrons to higher potential. More particularly, an electron at low voltage absorbs a plasmon and simultaneously tunnels across the oxide to higher potential. Backflow is prevented by making the low voltage electrode a large bandgap semiconductor. In a circuit, the operating voltage is supplied by the tunneling current and load resistance, which is varied for different diodes in the array.

ALTERNATE EMBODIMENTS OF THE INVENTION

Instead of using surface plasmons for energy transport, it is contemplated that other types of guided electromagnetic waves may be utilized. More particularly, alternate embodiments are contemplated which would utilize a spectrum of guided light-waves in a fiber optic cable or waveguide because the longer propagation distance would facilitate the use of remotely located diodes.

Concentrated sunlight is not necessarily required. Most phase-matching devices require collimated light. However, suitably textured surfaces may facilitate coupling to natural sunlight with a range of incidence angles. Space arrays can be pointed within fractions of a degree, and it may be preferable to avoid the angular dispersion introduced by concentrator optics. It is further contemplated that prism-couplers, textured surfaces, antenna, or endfire geometries may be used for plasmon excitation instead of the grating and lens configuration of the preferred embodiment.

In some designs the p and s polarized components may be coupled separately or sequentially. By way of example, prism-couplers provide for very efficient (99%) coupling of monochromatic p-polarized light to surface plasmons on a smooth metal film while the s-polarized light has high reflectivity.

Reradiation losses may be reduced by a variety of structures, such as by using waveguides for light trapping, or by gradually detuning the optical system. The plasmon range can also be increased by using very thin films and favorable materials to reduce ohmic loss, and by minimizing surface roughness which can cause scattering.

Plasmons of different frequencies may propagate in the same direction, or they may be guided towards appropriate diodes using techniques well known in integrated optics, such as chirped gratings or variable refractive indices. The diodes may be randomly distributed, arranged in an array, or aligned sequentially because only the highest energy plasmons are absorbed in a high voltage diode. Also, the diode may be frequency-specific, as occurs when gratings are used to couple plasmons into the tunnels. To obtain coupling between surface plasmons and junction plasmons over a broader frequency range, it may be preferable to use textured surfaces or local antenna structures rather than gratings. The phase matching condition can be relaxed by breaking the translational symmetry, such as by using finite lateral structures. Taper geometries which provide for gradual hybridization of surface and junction modes, or discontinuous geometries causing a mode conversion, may also provide means for coupling energy into the tunnels.

It is not necessary to use the inelastic tunnel diodes described in copending patent application Ser. No. 486,471. For example, alternate embodiments might use tunable photovoltaic devices made from superlattices, which are periodic sandwich structures composed of very thin (roughly 100 angstroms) semiconductor films. These synthetic semiconductors have unique band structures with a variable bandgap controlled by layer thickness. By way of example, gallium arsenide absorbs above 1.43 eV but a superlattice of doped galium arsenide layers can be semimetallic or absorbing in the infrared. Also, a superlattice of two different semiconductors, such as GaAs and AlAs, can have a range of intermediate bandgaps depending on geometry. For other combinations, such as GaSB and InAS, the effective bandgap of the superlattice can be much lower than that of either material. Finally, the solar energy converter could be used for other applications, such as laser energy conversion, broadband photodetection, optical information systems, or acousto-optical signal processors. Some of the advantages are discussed in copending application Ser. No. 486,471. Also, the device may be used in other frequency ranges, such as in the infrared where plasmons are not lost as readily, and where longer grating periods can be used. In particular, applications are contemplated in the 10 micron wavelength range which is particularly important because of the carbon dioxide laser, the excellent atmospheric transmission at this wavelength, and the poor quality of existing semiconductor photodiodes.

While several embodiments of the invention have been shown and described, it will be appreciated that various modifications can be made to the structure and procedures without departing from the spirit of the invention or the scope of the subjoined claims.

I claim:

1. Apparatus for converting sunlight to electricity by extracting energy from photons therein comprising
    an electrically conducting member,
    means for dispersing sunlight over a surface of said member to polarize the surface charge thereon thereby inducing oscillations in the valence electron density at said surface to produce surface plasmons and for phase-matching photons and surface plasmons of the same energy so that energy is transferred from said photons to said plasmons, and means for extracting energy from said surface plasmons and converting the same to electricity.

2. Apparatus for converting sunlight to electricity as claimed in claim 1 wherein the dispersing and phase-matching means provide a continuous spectrum of surface plasmons having different frequencies, and
   said energy extracting means being adapted to extract maximum power from the surface plasmons in the different frequency bands.

3. Apparatus for converting sunlight to electricity as claimed in claim 2 wherein the dispersing and phase-matching means includes a prism.

4. Apparatus for converting sunlight to electricity as claimed in claim 2 wherein the dispersing and phase-matching means includes at least one diffraction grating.

5. Apparatus for converting sunlight to electricity as claimed in claim 2 wherein the dispersing and phase-matching means includes a textured surface.

6. Apparatus for converting sunlight to electricity as claimed in claim 2 wherein the energy extracting means includes at least one tunnel diode.

7. Apparatus for converting sunlight to electricity by extracting energy from fast moving photons therein comprising
   means for phase-matching photons and plasmons of the same energy thereby providing self-sustaining surface plasmons for transporting energy, and
   means for extracting energy from said surface plasmons and converting the same to electricity.

8. Apparatus for converting sunlight to electricity as claimed in claim 7 wherein the phase-matching means includes a prism and a diffraction grating.

9. Apparatus for converting sunlight to electricity as claimed in claim 7 wherein the phase-matching means includes a prism coupler.

10. In apparatus for converting sunlight including photons to electricity by extracting energy from photons therein, the improvement comprising
    a conducting member for supporting a spectrum of surface plasmons,
    means for phase matching photons and plasmons of the same energy whereby said plasmons are excited by said photons, and
    at least one diode means for extracting energy from said plasmons that are excited by said photons, said diode means being tuned to extract substantially the maximum power from said plasmons.

11. Apparatus for converting sunlight to electricity as claimed in claim 10 wherein the conducting member includes a thin film.

12. Apparatus for converting sunlight to electricity as claimed in claim 11 wherein the thin film has a thickness between about 100 angstroms and 600 angstroms.

13. Apparatus for converting sunlight to electricity as claimed in claim 11 wherein the thin film is a metal.

14. Apparatus for converting sunlight to electricity as claimed in claim 13 wherein the thin film is supported by a substrate.

15. Apparatus for converting sunlight to electricity as claimed in claim 10 including optical means for splitting the sunlight into a series of different frequency bands of polarized photons for exciting said plasmons.

16. Apparatus for converting sunlight to electricity as claimed in claim 10 including a diffraction grating on the surface of said conducting member.

17. Apparatus for converting sunlight to electricity as claimed in claim 16 wherein the diffraction grating has a deep surface texture on the scale of wavelengths thereby providing effective coupling of the polarized photons to said plasmons.

18. Apparatus for converting sunlight to electricity as claimed in claim 17 including a plurality of diodes adjacent to said diffraction grating, each of said diodes being tuned to extract maximum power from said plasmons in said frequency bands.

19. Apparatus for converting sunlight to electricity as claimed in claim 10 wherein the phase matching means is of a high refractory index material.

20. Apparatus for converting sunlight to electricity as claimed in claim 19 including a prism coupler so that phase matching occurs at specific incident angles.

* * * * *